US010811457B2

(12) United States Patent
Na et al.

(10) Patent No.: US 10,811,457 B2
(45) Date of Patent: Oct. 20, 2020

(54) ARRAY SUBSTRATE FOR DIGITAL X-RAY DETECTOR, DIGITAL X-RAY DETECTOR INCLUDING THE SAME, AND METHOD FOR MANUFACTURING THE SAME

(71) Applicant: LG DISPLAY CO., LTD., Seoul (KR)

(72) Inventors: Hyungil Na, Seoul (KR); Hanseok Lee, Goyang-si (KR); JungJune Kim, Seoul (KR); Seungyong Jung, Paju-si (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 16/121,411

(22) Filed: Sep. 4, 2018

(65) Prior Publication Data
US 2019/0074321 A1  Mar. 7, 2019

(30) Foreign Application Priority Data

Sep. 5, 2017  (KR) .......................... 10-2017-0113021

(51) Int. Cl.
| | |
|---|---|
| *H01L 27/146* | (2006.01) |
| *H01L 27/12* | (2006.01) |
| *H01L 29/786* | (2006.01) |
| *G01T 1/24* | (2006.01) |
| *G01T 1/20* | (2006.01) |

(52) U.S. Cl.
CPC ...... *H01L 27/14663* (2013.01); *G01T 1/2018* (2013.01); *G01T 1/241* (2013.01); *H01L 27/1225* (2013.01); *H01L 27/1248* (2013.01); *H01L 27/14616* (2013.01); *H01L 27/14689* (2013.01); *H01L 29/7869* (2013.01); *H01L 29/78633* (2013.01)

(58) Field of Classification Search
CPC ............ H01L 27/14636; H01L 27/146; H01L 27/14612; H01L 31/10; H01L 27/14692; H01L 31/022408; H01L 31/117
See application file for complete search history.

(56) References Cited

U.S. PATENT DOCUMENTS

| | | | | |
|---|---|---|---|---|
| 10,136,091 | B2 * | 11/2018 | Ono ..................... | H04N 5/2173 |
| 10,276,611 | B2 * | 4/2019 | Nakano ................ | H01L 29/786 |
| 2009/0108209 | A1 * | 4/2009 | Jung ..................... | G01T 1/2018 |
| | | | | 250/370.11 |
| 2010/0171122 | A1 * | 7/2010 | Eguchi ............. | H01L 27/14603 |
| | | | | 257/66 |
| 2016/0284749 | A1 * | 9/2016 | Kurokawa ........ | H01L 27/14616 |
| 2018/0301495 | A1 * | 10/2018 | Ito ..................... | H01L 27/14636 |

* cited by examiner

*Primary Examiner* — Dung A. Le
(74) *Attorney, Agent, or Firm* — Birch, Stewart, Kolasch & Birch, LLP

(57) ABSTRACT

An array substrate for a digital X-ray detector can include a base substrate; a thin film transistor disposed on the base substrate; a PIN diode including a lower electrode electrically connected to the thin film transistor, a first PIN layer disposed on the lower electrode, and an upper electrode disposed on the first PIN layer; a second PIN layer spaced apart from the PIN diode, the second PIN layer being disposed on the thin film transistor; and a bias electrode electrically connected to the upper electrode.

20 Claims, 12 Drawing Sheets

(a)

(b)

(a)

(b)

(a)

(b)

(a)

121c 123 122 121a 121b (b)

125b 121c 123 122 121a 121b 125a (c)

125b 126b 122  121  123 126a 125a
         121c 121a 121b
         120

(d)

(e)

(f)

(g)

(h)

(i)

(j)

(k)

(a)   (b)

ARRAY SUBSTRATE FOR DIGITAL X-RAY DETECTOR, DIGITAL X-RAY DETECTOR INCLUDING THE SAME, AND METHOD FOR MANUFACTURING THE SAME

CROSS-REFERENCE TO RELATED APPLICATIONS

This application claims the priority of Korean Patent Application No. 10-2017-0113021 filed in the Republic of Korea on Sep. 5, 2017, the entirety of which is hereby incorporated by reference into the present application.

BACKGROUND

1. Technical Field

The present disclosure relates to an array substrate for a digital X-ray detector to reduce damage of a thin film transistor (TFT) without using additional fabrication, a digital X-ray detector including the same, and a method for manufacturing the same.

2. Description of the Related Art

With the rapid development of digital technology, a digital X-ray detector based on a thin film transistor (TFT) has recently been developed and rapidly come into medical use. The digital X-ray detector refers to an apparatus capable of detecting the transmission amount (e.g., transmissivity) of X-rays passing through a subject and displaying internal images of the subject on a display.

Generally, the digital X-ray detector may be classified into a direct digital X-ray detector for directly detecting X-rays and an indirect digital X-ray detector for indirectly detecting X-rays. The digital X-ray detector is generally designed to have several thousand or tens of thousands of pixels, or many more pixels according to the size or resolution thereof. FIG. 1 is a schematic cross-sectional view illustrating a portion corresponding to a single pixel for use in a related art indirect digital X-ray detector.

Generally, the indirect digital X-ray detector 1 may include a thin film transistor 20 disposed over a substrate 10, a PIN diode 30 connected to the thin film transistor 20, and a scintillator 50 disposed over the PIN diode 30.

When X-rays are emitted to the digital X-ray detector, the scintillator 50 converts the incident X-rays into visible light, such that the visible light is transmitted to the PIN diode 30 disposed below the scintillator 50. The PIN diode 30 includes a lower electrode 31, a PIN layer 33, and an upper electrode 35.

The upper electrode 35 of the PIN diode 30 is connected to a bias electrode 45 through a contact hole 41 formed in a protective layer 40, and the bias electrode 45 transmits a power-supply voltage to the PIN diode 30.

The visible light applied to the PIN diode 30 is reconverted into an electronic signal in a PIN layer 33. The electronic signal is converted into an image signal after passing through the thin film transistor 20 connected to the lower electrode 31 of the PIN diode 30, such that the resultant image signal is displayed on a display.

The thin film transistor 20 includes a gate electrode 21, a semiconductor layer 23, a source electrode 25, and a drain electrode 27. Specifically, the thin film transistor 20 is very vulnerable to X-rays, and the semiconductor layer 23 is especially vulnerable, such that the thin film transistor 20 may be easily damaged by X-rays. If the thin film transistor 20 is damaged, the digital X-ray detector 1 may unexpectedly malfunction, such that many developers and companies are conducting intensive research into various methods for minimizing damage to the thin film transistor 20.

Although the protective layer formed to cover the thin film transistor 20 can also shield and absorb X-rays, the X-ray shielding and absorbing effects are limited. Therefore, in order to improve the shielding and absorbing effects of X-rays, it is necessary for the protective layer 40 to have a larger thickness, such that the overall thickness of the digital X-ray detector 1 is unavoidably increased.

SUMMARY

Therefore, the present disclosure has been made in view of the above problems, and it is an object of the present disclosure to provide an array substrate for a digital X-ray detector to minimize the number of malfunctions of the digital X-ray detector by reducing thin film transistor (TFT) damage caused by X-rays, and the digital X-ray detector including the same.

It is another object of the present disclosure to provide an array substrate for a digital X-ray detector to minimize a thickness of the digital X-ray detector as well as to have superior X-ray shielding and absorbing effects, and the digital X-ray detector including the same.

It is another object of the present disclosure to provide an array substrate for a digital X-ray detector to maximize fabrication efficiency by minimizing thin film transistor (TFT) damage caused by X-rays without using additional fabrication, the digital X-ray detector including the same, and a method for manufacturing the same.

Objects of the present disclosure are not limited to the above-described objects and other objects and advantages can be appreciated by those skilled in the art from the following descriptions. Further, it will be easily appreciated that the objects and advantages of the present disclosure can be practiced by means recited in the appended claims and a combination thereof.

Various embodiments of the present disclosure are directed to providing an array substrate for a digital X-ray detector, the digital X-ray detector including the same, and a method for manufacturing the same, that substantially obviate one or more problems due to limitations and disadvantages of the related art.

In accordance with one aspect of the present disclosure, an array substrate for a digital X-ray detector includes a base substrate, a thin film transistor disposed over the base substrate, a PIN diode including a lower electrode connected to the thin film transistor, a first PIN layer disposed over the lower electrode, and an upper electrode disposed over the first PIN layer, a second PIN layer spaced apart from the PIN diode, and disposed over the thin film transistor, and a bias electrode connected to the upper electrode. The digital X-ray detector includes the array substrate and a scintillator disposed over the array substrate.

In this instance, the second PIN layer is spaced apart from a first PIN diode, and is disposed to cover a semiconductor layer and a gate electrode, such that thin film transistor (TFT) damage caused by X-rays may be minimized.

In accordance with another aspect of the present disclosure, a method for manufacturing an array substrate for a digital X-ray detector includes forming a thin film transistor over a base substrate, forming a first protective layer to cover the thin film transistor, forming a second contact hole in the first protective layer, and forming a lower electrode connected to the thin film transistor through the second contact hole, forming a PIN film to cover the first protective layer and the lower electrode, forming an upper electrode over the PIN film corresponding to the lower electrode, and forming a second PIN layer corresponding to the thin film transistor and a first PIN layer corresponding to the lower electrode by etching the PIN film, in which the second PIN layer and the first PIN layer are spaced apart from each other.

In this instance, the second PIN layer can be formed of the same material as the first PIN layer, and can be formed by the same process as the first PIN layer, such that the second PIN layer can be formed without using additional fabrication needed to add the second PIN layer, such that fabrication efficiency can be maximized and thin film transistor (TFT) damage can be minimized.

DETAILED DESCRIPTION

Figure 1:
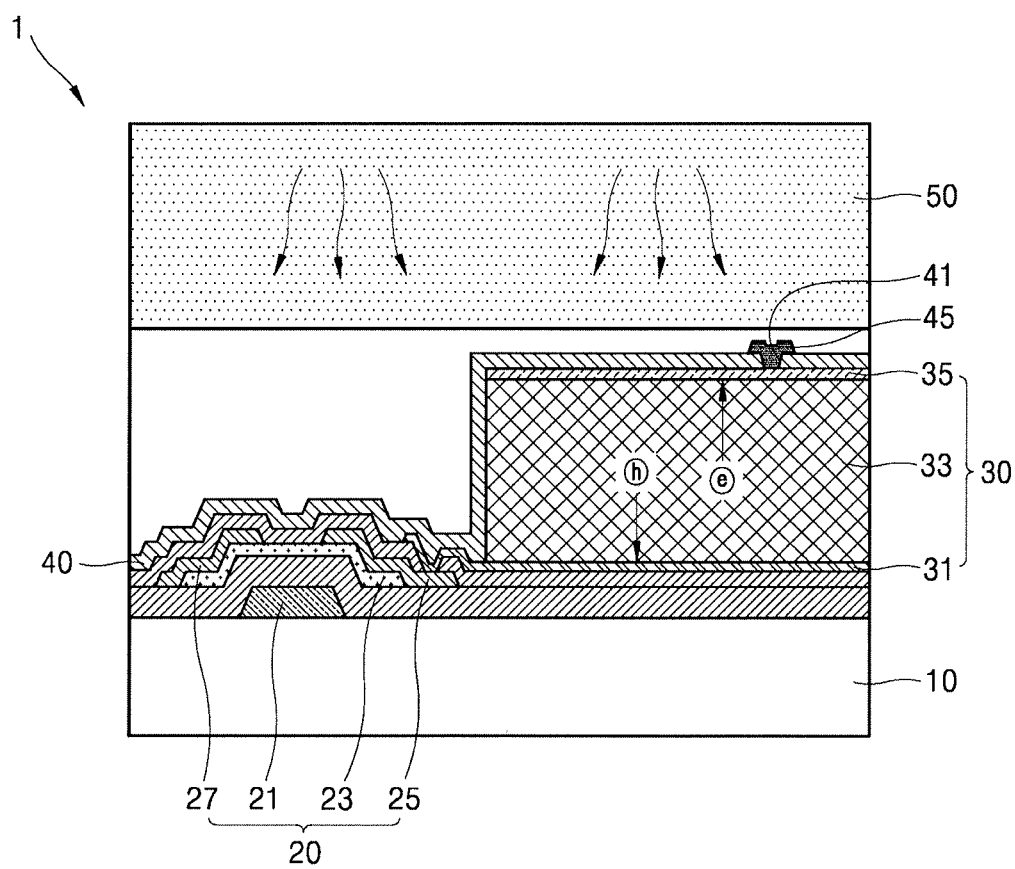
FIG. 1 is a schematic cross-sectional view illustrating a related art digital X-ray detector.

The above objects, features and advantages will become apparent from the detailed description with reference to the accompanying drawings. Embodiments are described in sufficient detail to enable those skilled in the art in the art to easily practice the technical idea of the present disclosure. Detailed descriptions of well-known functions or configurations may be omitted in order not to unnecessarily obscure the gist of the present disclosure. Hereinafter, embodiments of the present disclosure will be described in detail with reference to the accompanying drawings. Throughout the drawings, like reference numerals refer to like elements.

The embodiments of the present disclosure will hereinafter be described with reference to the attached drawings.

In the following description, assuming that a certain object is formed above (over) or below (beneath) the respective constituent elements, this means that two constituent elements are brought into direct contact with each other, or one or more constituent elements are disposed and formed between two constituent elements. In addition, assuming that a certain object is formed over or below the respective constituent elements, this means that the object may also be arranged in upward or downward directions based on the position of one constituent element.

When one element is referred to as being "connected to", "coupled to", or "accessed by" another element, one element may be "connected to", "coupled to", or "accessed by" another element via a further element although one element may be directly connected to or directly accessed by another element.

Figure 2:
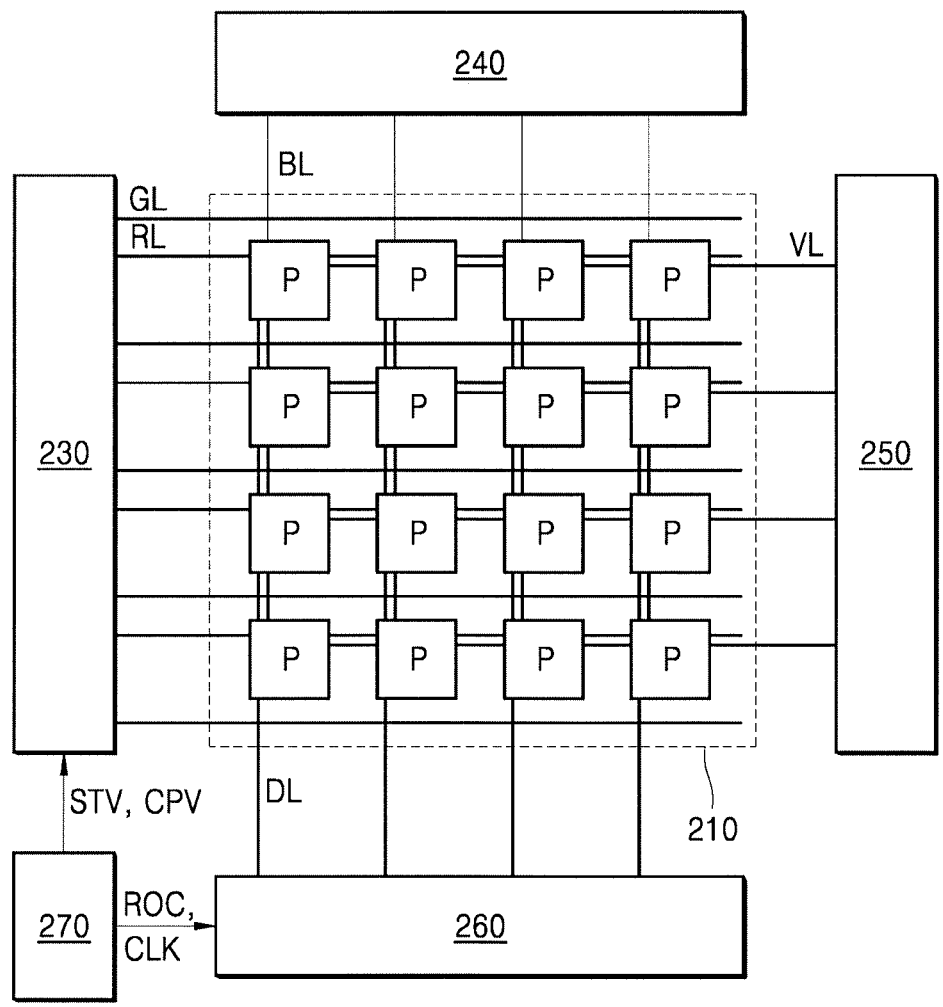
FIG. 2 is a schematic plan view illustrating a digital X-ray detector an embodiment of the present disclosure.

FIG. 2 is a schematic plan view illustrating a digital X-ray detector. Referring to FIG. 2, the digital X-ray detector can include a thin film transistor (TFT) array 210, a gate driver 230, a bias supplier 240, a power-supply voltage supplier 250, a readout circuit 260, and a timing controller 270.

The TFT array 210 can sense X-rays emitted from an energy source, perform photoelectric conversion of the sensed signal, and thus can output an electrical detection signal. In the TFT array 210, each cell region can be defined not only by a plurality of gate lines (GL) arranged in a horizontal direction, but also by a plurality of data lines (DL) arranged in a vertical direction perpendicular to the horizontal direction. Each cell region of the TFT array 210 can include a plurality of photosensitive pixels (P) arranged in a matrix.

Each photosensitive pixel (P) can include a PIN diode configured to sense light converted from X-rays and output the sensed light as a signal, and a thin film transistor (TFT) configured to transmit a detection signal output from the PIN diode in response to a gate signal. One side of the PIN diode can be connected to the thin film transistor (TFT), and the other side thereof can be connected to a bias line (BL).

A gate electrode of the thin film transistor (TFT) can be connected to the gate line (GL) through which a scan signal is transmitted, a source electrode can be connected to the PIN diode, and a drain electrode can be connected to the data line (DL) through which the detection signal is transmitted. The bias line BL can be arranged parallel to the data line (DL).

The gate driver 230 can sequentially apply a plurality of gate signals, each of which has a gate-ON voltage level, through the gate lines (GL). The gate driver 230 cam also apply a plurality of reset signals, each of which has a gate-ON voltage level, through a plurality of reset lines (RL). Here, the gate-ON voltage level can refer to a voltage level at which thin film transistors of the photosensitive pixels can be turned on. The thin film transistors of the photosensitive pixels can be turned on in response to a gate signal or a reset signal.

The gate driver 230 can be an integrated circuit (IC) such that the gate driver 230 is populated on an external substrate connected to the TFT array 210 or can be formed over the TFT array 210 through a Gate In Panel (GIP) process.

The bias supplier 240 can apply a drive voltage through bias lines (BL). The bias supplier 240 can apply a predetermined voltage to the PIN diode. In this instance, the bias supplier 240 can selectively apply a reverse bias or a forward bias to the PIN diode.

The power-supply voltage supplier 250 can supply a power-supply voltage to the photosensitive pixels through power-supply voltage lines (VL).

The readout circuit 260 can read out the detection signal generated from the thin film transistor (TFT) that is turned on in response to the gate signal. Accordingly, the detection signal generated from the PIN diode can be input to the readout circuit 260 through the data lines (DL).

The readout circuit 260 can include a signal detector, a multiplexer, etc. The signal detector can include a plurality of amplification circuits corresponding to the data lines (DL) on a one to one basis, and each amplification circuit can include an amplifier, a capacitor, a reset element, etc.

In order to control the gate driver 23Q, the timing controller 270 can generate a start signal (STV), a clock signal (CPV), etc., and transmit the start signal (STV), the clock signal (CPV), etc., to the gate driver 230. In order to control the readout circuit 260, the timing controller 270 can generate a readout control signal (ROC), a readout clock signal (CLK), etc., and transmit the readout control signal (ROC), the readout clock signal (CLK), etc., to the readout circuit 260.

Figure 3:
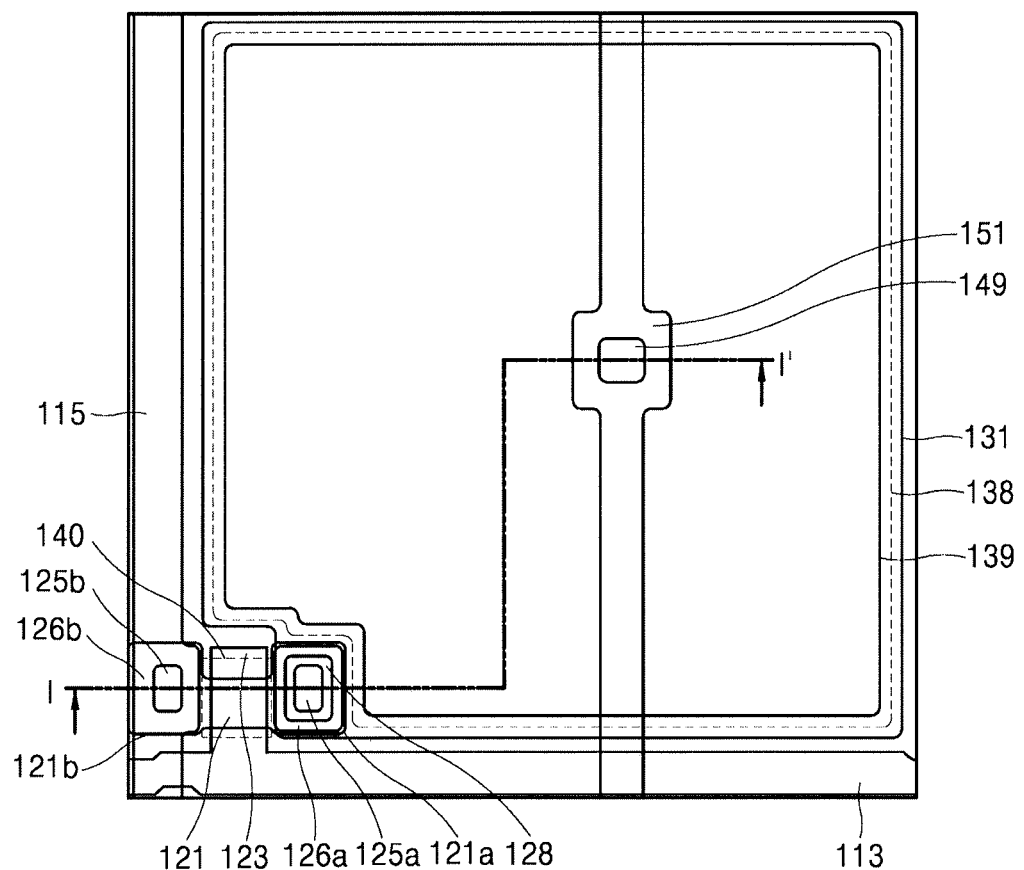
FIG. 3 is a plan view illustrating an array substrate for a digital X-ray detector according to an embodiment of the present disclosure.
Figure 4:
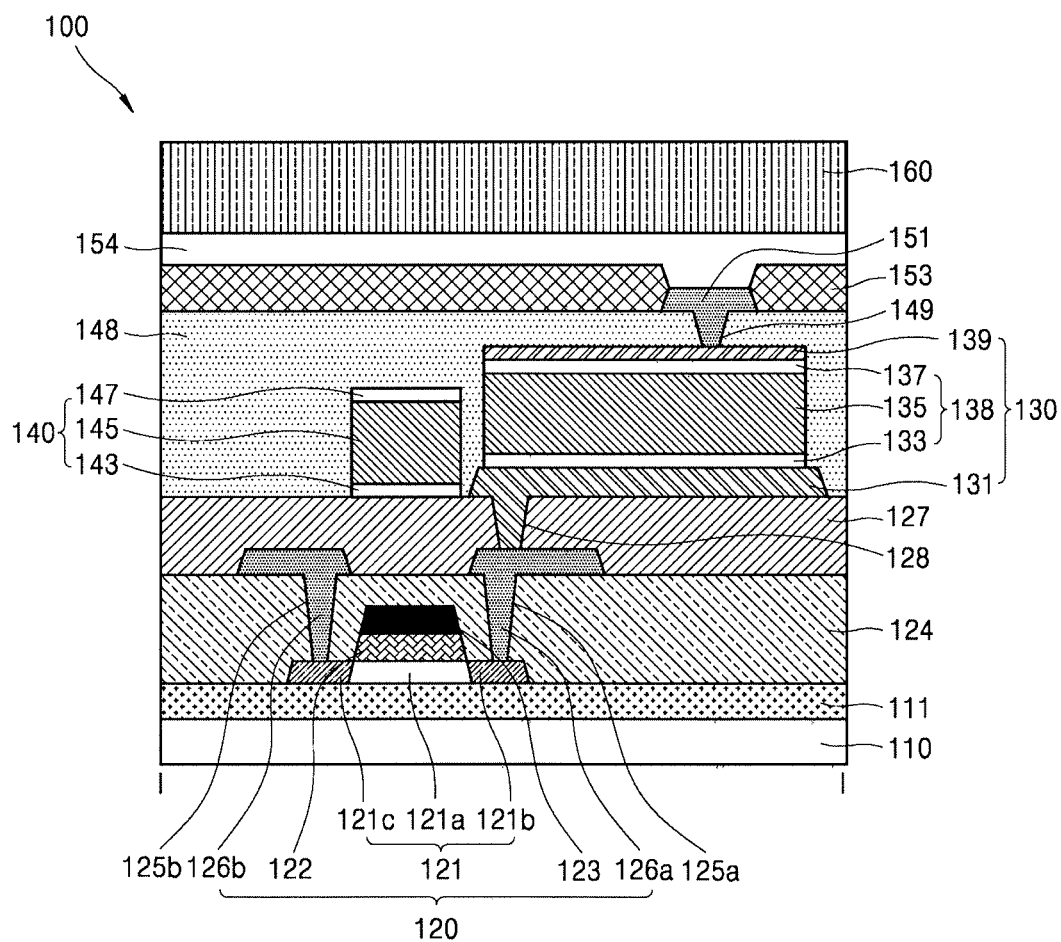
FIG. 4 is a cross-sectional view illustrating an array substrate for a digital X-ray detector according to an embodiment of the present disclosure.

FIG. 3 is a plan view illustrating a portion corresponding to a single pixel for use in an array substrate for a digital X-ray detector according to an embodiment of the present disclosure. FIG. 4 is a cross-sectional view illustrating a portion corresponding to a single pixel for use in an array substrate for a digital X-ray detector according to an embodiment of the present disclosure. An array substrate for a digital X-ray detector and the digital X-ray detector including the same according to the embodiments of the present disclosure will hereinafter be described with reference to FIGS. 3 and 4.

The array substrate for the digital X-ray detector according to one embodiment of the present disclosure can include a base substrate 110, a thin film transistor 120 disposed over the base substrate 110, a PIN diode 130, a second PIN layer 140 disposed over the thin film transistor 120 while being spaced apart from the PIN diode 130, and a bias electrode 151 connected to the upper electrode 139. Here, the PIN diode can include a lower electrode 131 connected to the thin film transistor 120, a first PIN layer 138 disposed over the lower electrode 131, and an upper electrode 139 disposed over the first PIN layer 138.

Pixel regions can be defined by intersection regions of the gate lines 113 arranged in one direction and the data lines 115 arranged in the other direction perpendicular to the gate lines 113, and each of the pixel regions can include a thin film transistor 120 and a PIN diode 130.

The thin film transistor 120 can be disposed over the base substrate 110, and a buffer layer 111 can be disposed between the base substrate 110 and the thin film transistor 120. The buffer layer 111 can be a monolayer or multilayer structure formed of a silicon oxide (SiOx) film or a silicon nitride (SiNx) film.

Although the embodiment has disclosed that the thin film transistor 120 is formed of an oxide thin film transistor (TFT) for convenience of description, the scope or spirit of the present disclosure is not limited thereto, and the thin film transistor 120 can also be formed of a Low Temperature Polycrystalline Silicon (LTPS) or amorphous silicon thin film transistor (a-Si TFT) without departing from the scope and spirit of the present disclosure. The thin film transistor 120 according to the present disclosure can be constructed as follows.

First, the thin film transistor 120 can include a semiconductor layer 121 formed of indium gallium zinc oxide (IGZO). In this instance, the semiconductor layer 121 can include a channel region 121a through which electrons move, and a source region 121b and a drain region 121c, each of which is doped with impurities through doping, can be respectively formed at both ends of the channel region 121a. In this instance, each of the source and drain regions 121b and 121c can include an ohmic contact layer for reducing contact resistance regarding a first electrode 126a and a second electrode 126b. However, if the semiconductor layer 121 is formed of indium gallium zinc oxide (IGZO), the semiconductor layer 121 formed of IGZO has superior electrical contact characteristics, such that formation of the ohmic contact layer may be omitted as necessary.

A gate electrode 123 extending from the gate line 113 can be disposed over the semiconductor layer 121 (specifically, over the channel region 121a of the semiconductor layer 121). The gate electrode 123 can be formed of any one material selected from a group composed of molybdenum (Mo), aluminum (Al), chrome (Cr), gold (Au), titanium (Ti), nickel (Ni), and copper (Cu), or can be formed of alloys thereof. The gate electrode 123 can be formed of a monolayer or multilayer structure. Since the gate electrode 123 disposed over the semiconductor layer 121 is formed of high-density metal, the gate electrode 123 can also be used as a shielding material for preventing the semiconductor layer 121 from being damaged by X-rays.

A gate insulation layer 122 can be disposed between the gate electrode 123 and the semiconductor layer 121. The gate electrode 122 can be formed of a monolayer or multilayer structure formed of a silicon oxide (SiOx) film or silicon nitride (SiNx) film. The semiconductor layer 121 not covered with the gate insulation layer 122 can correspond to the source and drain regions 121b and 121c.

An interlayer insulation layer (also called an interlayer dielectric (ILD) layer) 124 can be formed to cover the semiconductor layer 121 and the gate electrode 123. The interlayer insulation layer 124 can include first contact holes 125a and 125b. In this instance, the first electrode 126a is connected to the source region 121b through the first contact hole 125a, and the second electrode 126b is connected to the drain region 121c through the first contact hole 125b. The interlayer insulation layer 124 can be formed of a monolayer or multilayer structure formed of SiOx or SiNx. In this instance, the positions of the source region 121b and the drain region 121c can also be interchanged according to a voltage applied thereto.

The first electrode 126a and the second electrode 126b can be formed of any one material selected from a group composed of molybdenum (Mo), aluminum (Al), chrome (Cr), gold (Au), titanium (Ti), nickel (Ni), and copper (Cu), or can be formed of alloys thereof. The first electrode 126a and the second electrode 126b can be formed of a monolayer or multilayer structure. In this instance, the first electrode 126a can be used as a source electrode, and the second electrode 126b can be used as a drain electrode.

The above-mentioned thin film transistor 120 can be implemented not only as a top gate structured TFT as shown in the embodiment, but also as a bottom gate structured TFT, and can also be implemented as a coplanar or staggered TFT without departing from the scope and spirit of the present disclosure.

A first protective layer 127 can be disposed not only over the first electrode 126a connected to the semiconductor layer 121 through the first contact hole 125a, but also over the second electrode 126b connected to the semiconductor layer 121 through the first contact hole 125b.

The lower electrode 131 of the PIN diode 130 can be disposed over the first protective layer 127, such that the lower electrode 131 can be connected to the first electrode 126a of the thin film transistor 120 through a second contact hole 128 disposed over the first electrode 126a. The lower electrode 131 can be used as a pixel electrode of the thin film transistor 120. In addition, an additional pixel electrode separated from the lower electrode 131 of the PIN diode 130 can be used, such that the first electrode 126a of the thin film transistor 120 and the lower electrode 131 of the PIN diode 130 can also be connected to the additional pixel electrode as necessary.

The lower electrode 131 can be formed of a non-transparent metal material such as molybdenum (Mo) or a transparent oxide material such as indium tin oxide (ITO) according to characteristics of the PIN diode 130.

In an embodiment, the lower electrode 131 does not overlap with the gate electrode 123 of the thin film transistor 120. If the lower electrode 131 is disposed to overlap with the gate electrode 123, parasitic capacitance may occur between the lower electrode 131 and the gate electrode 123. In order to prevent occurrence of parasitic capacitance between the lower electrode 131 and the gate electrode 123 that overlap each other, the interlayer insulation layer 124 or the first protective layer 127 can have increased thickness.

The first PIN layer 138 in which a first N-type semiconductor layer 133 having N-type impurities, a first intrinsic semiconductor layer 135 having no impurities, and a first P-type semiconductor layer 137 having P-type impurities can be sequentially stacked, and disposed over the lower electrode 131. The upper electrode 139 can be disposed over the first PIN layer 138.

The first intrinsic semiconductor layer 135 can be formed to have a larger thickness as compared to the first N-type semiconductor layer 133 and the first P-type semiconductor 137. The first PIN layer 138 can include a material capable of converting X-rays emitted from an energy source into an electric signal. For example, the first PIN layer 138 can include amorphous selenium (a-Se), mercuric iodide (HgI2), cadmium telluride (CdTe), lead oxide (PbO), lead iodide (PbI2), bismuth triiodide (BiI3), gallium arsenide (GaAs), germanium (Ge), and the like.

Preferably, the upper electrode 139 can be formed of a transparent conductive material, such as indium tin oxide (ITO) or indium zinc oxide (IZO) to increase light transmission efficiency of the scintillator 160 that receives X-rays and performs conversion of a wavelength of the X-rays.

The PIN diode 130 can convert visible light into an electronic signal, and transmit the electronic signal to the thin film transistor 120 through the first electrode 126a acting as an electrically-connected source electrode. The electronic signal can be displayed as an image signal after passing through the data line 115 connected to the second electrode 126b acting as a drain electrode of the thin film transistor 120.

As described above, the PIN diode 130 can include the lower electrode 131, the first PIN layer 138, and the upper electrode 139. Preferably, the PIN diode 130 not overlap with the gate electrode 123 of the thin film transistor 120.

The entire region of the PIN diode 130 composed of the lower electrode 131, the first PIN layer 138, and the upper electrode 139 can generate an electric field. Therefore, when the PIN diode 130 is disposed to overlap the gate electrode 123, parasitic capacitance may also occur between the PIN diode 130 and the gate electrode 123. In order to prevent occurrence of such parasitic capacitance, the interlayer insulation layer 124 or the first protective layer 127 can have increased thickness.

Figure 5:
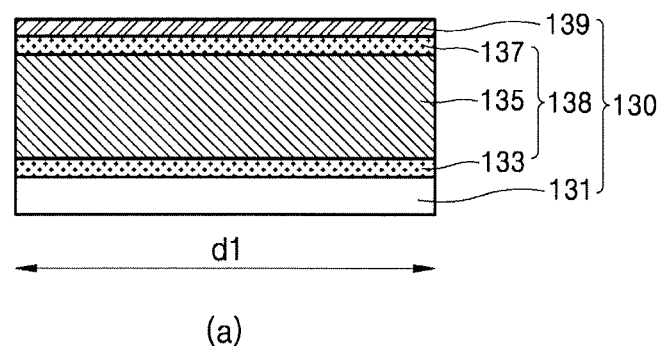
FIGS. 5 to 7 illustrate cross-sectional views of PIN diodes and voltage-current characteristic (V-I) graphs of the PIN diodes according to various embodiments of the present disclosure.
Figure 5:
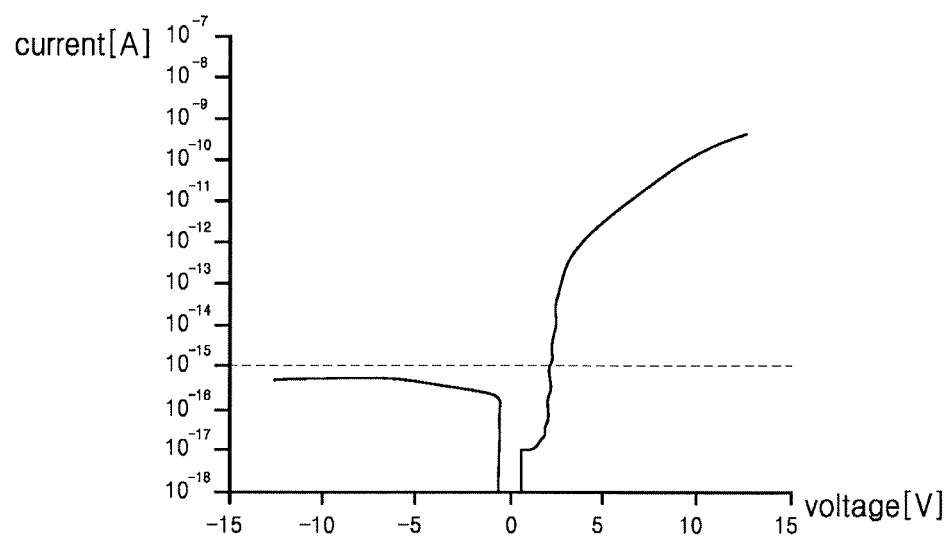
Figure 6:
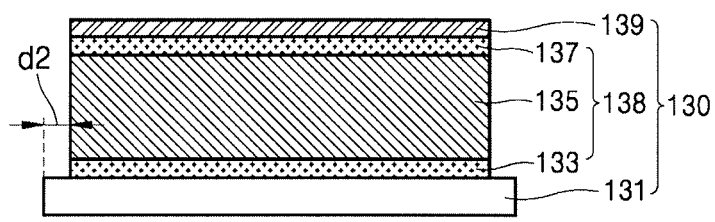
Figure 6:
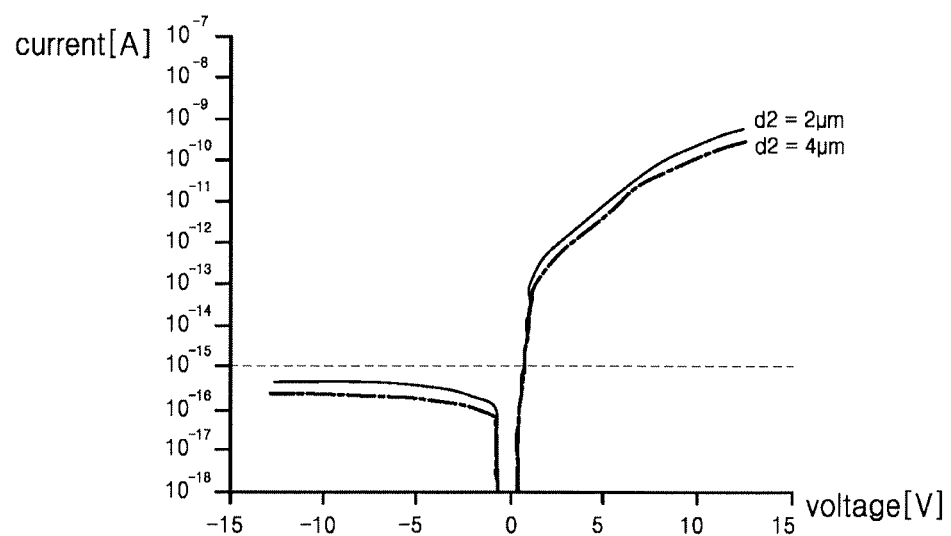
Figure 7:
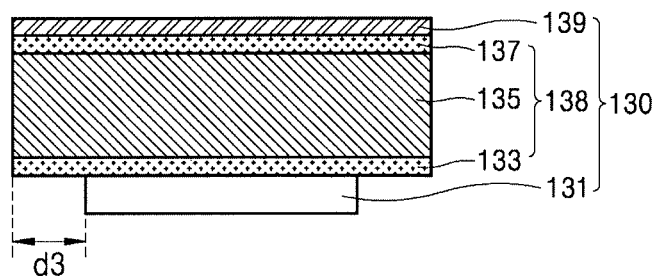
Figure 7:
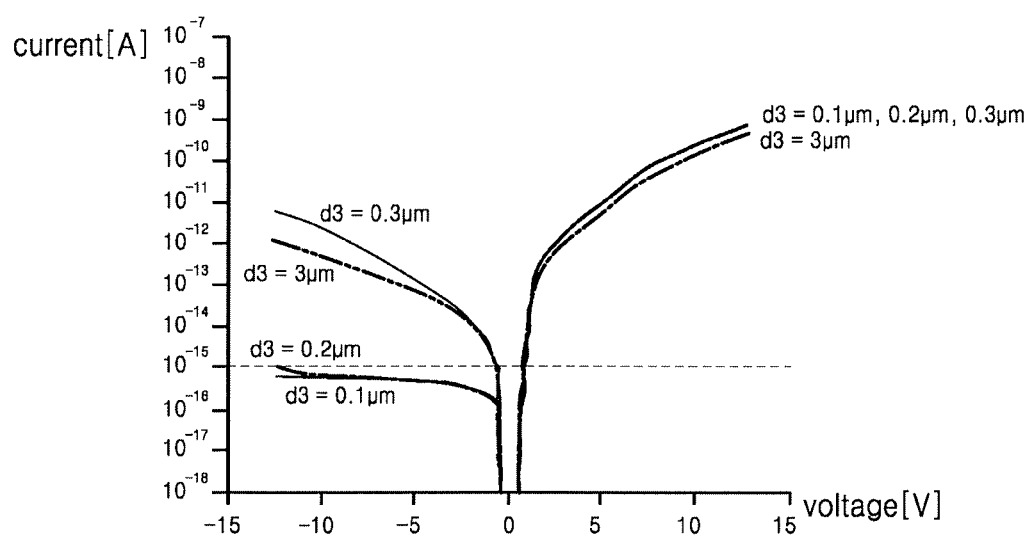

FIGS. 5 to 7 illustrate various examples of the PIN diode 130 in relation to the arrangement relationship between the first PIN layer 138 and the lower electrode 131, and also illustrate voltage-current (V-I) characteristic graphs regarding leakage current in the respective examples of the PIN diode 130.

In the PIN diode 130 as shown in (a) of FIG. 5, assuming that the length of the lower electrode 131 is identical to a length (d1) of the first PIN layer 138 disposed over the lower electrode 131, although a negative voltage is applied to the PIN diode 130 as shown in the graph at (b) of FIG. 5, it can be confirmed that a current [A] is stabilized and maintained at a predetermined level of $10^{-15}$ A or less without increasing the leakage current.

In the PIN diode 130 as shown in (a) of FIG. 6, since the first PIN layer 138 is located at an inner side of the lower electrode 131, the lower electrode 131 is longer in length than the first PIN layer 138, such that a distance difference (d2) can occur in one end from among both ends of the PIN diode 130.

In this instance, if the distance difference (d2) is set to 2 μm or 4 μm as shown in (b) of FIG. 6, although a negative voltage is applied to the PIN diode 130, it can be confirmed that a current [A] is stabilized and maintained at a predetermined level of $10^{-15}$ A or less without increasing the leakage current.

In the PIN diode 130 as shown in (a) of FIG. 7, the first PIN layer 138 is disposed over the lower electrode 131, and some regions of the first PIN layer 138 are located outside the lower electrode 131.

In this instance, the lower electrode 131 is shorter in length than the first PIN layer 138, such that a distance difference (d3) can occur in one end of the PIN diode 130. In this instance, if the distance difference (d3) is equal to or less than 0.2 μm (for example, d3=0.1 μm or d3=0.2 μm) as shown in (a) of FIG. 7, although a negative voltage is applied to the PIN diode 130, it can be confirmed that a current [A] is stabilized and maintained at a predetermined level of $10^{-15}$ A or less without increasing the leakage current.

In contrast, if the first PIN layer 138 is longer than the lower electrode 131 and a distance difference (d3) in one end of the PIN diode 130 is equal to or higher than 0.3 μm (for example, d3=0.3 μm or d3=3 μm), and if a negative voltage is applied to the PIN diode 130, it can be confirmed that a current [A] is continuously increased as shown in (b) of FIG. 7B.

That is, in order to implement stabilization of the leakage current, the length of the first PIN layer 138 be identical to the length of the lower electrode 131 or the first PIN layer 138 be disposed at an inner side of the lower electrode 131, according to an embodiment. In addition, if some regions of the first PIN layer 138 are located outside the lower electrode 131, the distance difference (d3) between the first PIN layer 138 and the lower electrode 131 in one end of the PIN diode 130 can be set equal to or less than 0.2 μm, resulting in stabilization of the leakage current, according to an embodiment. In others words, if the lower electrode is made too short relative to the first PIN layer 138, then unstable leakage current can occur. Thus, according to an embodiment the distance difference (d3) is set equal to or less than 0.2 μm, in order to stabilize leakage current.

Referring back to FIGS. 3 and 4, the second PIN layer 140 can be spaced apart from the PIN diode 130 including the first PIN layer 138, and can be disposed over the thin film transistor 120. A second N-type semiconductor layer 143, a second intrinsic semiconductor layer 145, and a second P-type semiconductor layer 147 can be sequentially stacked on the second PIN layer 140. If the second PIN layer 140 is formed by the same process as the first PIN layer 138, the second PIN layer 140 can have the same layer structure formed of the same material as that of the first PIN layer 138.

In order to prevent the thin film transistor 120 from being damaged by X-rays during X-ray emission toward the digital X-ray detector, the second PIN layer 140 can be disposed over the thin film transistor 120. Specifically, if the thin film transistor 120 includes an oxide semiconductor layer formed of IGZO, the resultant thin film transistor 120 can be more vulnerable to X-rays.

In the conventional art, the X-ray shielding and absorbing effects are largely limited in the protective layer (e.g., a second protective layer 148 or a third protective layer 153), and are thus considered unsatisfactory. In order to address this issue, the second PIN layer 140 having superior X-ray shielding and absorbing efficiency can be additionally disposed over the thin film transistor 120, such that X-ray damage to the thin film transistor 120 can be minimized.

In this instance, since the semiconductor layer 121 from among constituent elements of the thin film transistor 120 has the highest possibility of X-ray damage, the second PIN layer 140 can also be formed to cover the semiconductor layer 121 as necessary.

Since the embodiment of the present disclosure has disclosed the gate electrode 123 disposed over the semiconductor layer 121 for convenience of description, the second PIN layer 140 can also be disposed over the gate electrode 123 as necessary. Specifically, since the gate electrode 123 is disposed to correspond to the channel region 121a of the semiconductor layer 121, the gate electrode 123 can protect the channel region 121a of the semiconductor layer 121 having a high possibility of X-ray damage.

However, the scope or spirit of an arrangement format of the semiconductor layer 121, the gate electrode 123, the first electrode 126a, and the second electrode 126b contained in the thin film transistor 120 is not limited to the present disclosure, and it should be noted that a portion to be covered with the second PIN layer 140 can be changed to another portion according to such arrangement format. However, as described above, X-ray damage to the semiconductor layer 121 is at the highest damage level, such that, according to an embodiment, the second PIN layer 140 is disposed to at least cover the semiconductor layer 121, especially, the channel region 121a of the semiconductor layer 121 (e.g., since these areas of 121 are most vulnerable to X-ray damage).

The second PIN layer 140 can be arranged as an island structure while being spaced apart from the PIN diode 130 including the first PIN layer 138. The first PIN layer 138 can contact the lower electrode 131 and the upper electrode 139 of the PIN diode 130, such that an electric field can occur in the entirety of the PIN diode 130 including the first PIN layer 138 when a voltage is applied to the first PIN layer 138.

Therefore, when the PIN diode 130 is connected to the second PIN layer 140 without a gap therebetween, the electric field may also occur in the second PIN layer 140 when the electric field occurs in the PIN diode 130. Accordingly, parasitic capacitance may occur between the thin film transistor 120 and the second PIN layer 140 formed to cover the thin film transistor 120.

According to the embodiment of the present disclosure, the second PIN layer 140 can be formed as an island structure spaced apart from the PIN diode 130, and can prevent the electric field from being supplied to the second PIN layer 140, such that occurrence of parasitic capacitance is prevented and damage to the thin film transistor 120 can be minimized.

In addition, assuming that the PIN layer is formed to have a longer length than the lower electrode 131 to interconnect the first PIN layer 138 and the second PIN layer 140, the amount of leakage current may gradually increase in proportion to the length of the PIN layer as shown in FIG. 7. In order to address this issue, the second PIN layer 140 can be spaced apart from the PIN diode 130 without coupling to the PIN diode 130.

Therefore, the second PIN layer 140 disposed over the thin film transistor 120 (e.g., especially, over the semiconductor layer 121), and the lower electrode 131 disposed over the first protective layer 127 while being connected to the first electrode 126a of the thin film transistor 120 through the second contact hole 128 can be spaced apart from each other while being formed as the same layer on the first protective layer 127.

The second protective layer 148 can be formed to cover the PIN diode 130 and the second PIN layer 140. In this instance, a third contact hole 149 can be disposed at a region corresponding to the upper electrode 139 of the PIN diode 130, such that the upper electrode 139 can be connected to the bias electrode 151 through the third contact hole 149.

The bias electrode 151 can be connected to the upper electrode 139 of the PIN diode 130 such that a bias voltage capable of controlling electrons or holes of the PIN diode 130 is applied to the upper electrode 139. The bias electrode 151 can be formed of a non-transparent metal material, such as molybdenum (Mo) or aluminum neodymium (AlNd).

The third protective layer 153 can be disposed over the bias electrode 151, and the scintillator 160 can be disposed over the third protective layer 153, such that the digital X-ray detector is constructed. In this instance, an organic insulation layer 154 can be formed over the third protective layer 153 such that the scintillator 160 can be disposed over the organic insulation layer. According to an embodiment, the scintillator 160 can also be formed in a film shape and then be attached to the organic insulation layer. Through a separate growth process, the scintillator 160 can also be formed over the third protective layer 153. The scintillator 160 can be formed of cesium iodide.

The above-mentioned digital X-ray detector 100 can operate as follows.

X-rays emitted to the digital X-ray detector 100 can be converted into visible light by the scintillator 160. The visible light can be converted into an electronic signal by the first PIN layer 138 of the PIN diode 130. In more detail, when visible light is emitted to the first PIN layer 138, the first intrinsic semiconductor layer 135 is depleted by the first P-type semiconductor layer 137 and the first N-type semiconductor layer 133, and thus generates an electric field therein. Electrons and holes generated by light can be drifted by the electric field, and are then collected in the first P-type semiconductor layer 137 and in the first N-type semiconductor layer 133, respectively.

A method for manufacturing an array substrate for the digital X-ray detector according to one embodiment of the present disclosure will hereinafter be described with reference to FIG. 8.

Figure 8:
FIG. 8 is a cross-sectional view illustrating a method for manufacturing an array substrate for a digital X-ray detector according to an embodiment of the present disclosure.
Figure 8:
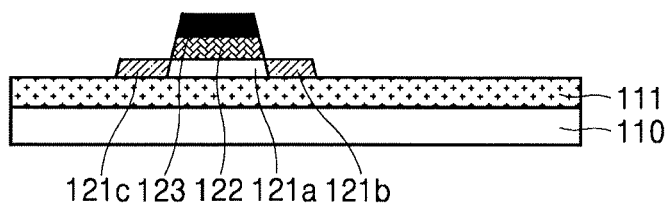
Figure 8:
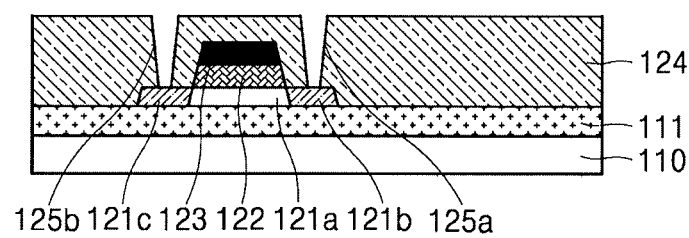
Figure 8:
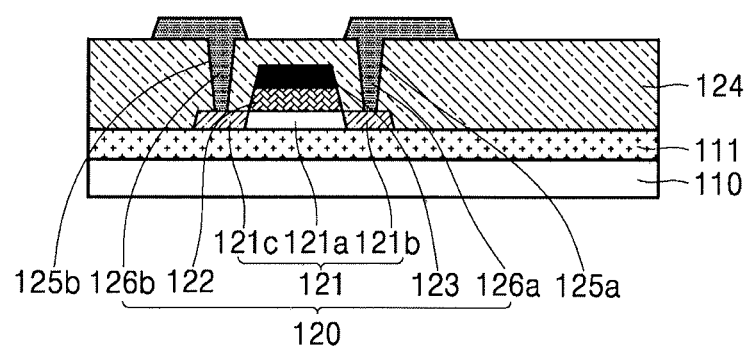
Figure 8:
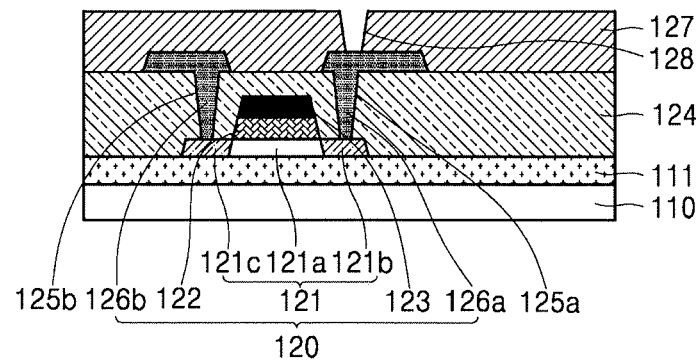
Figure 8:
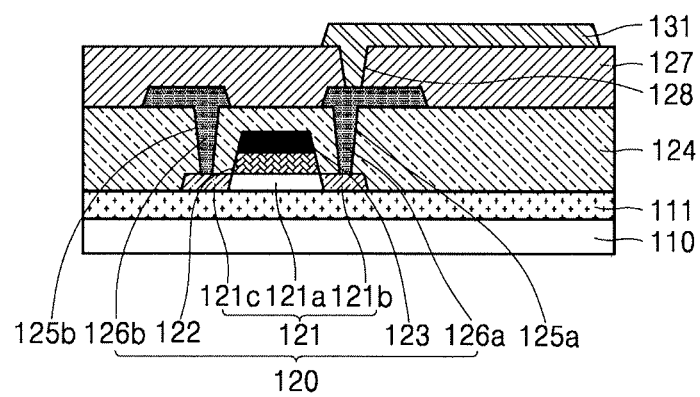
Figure 8:
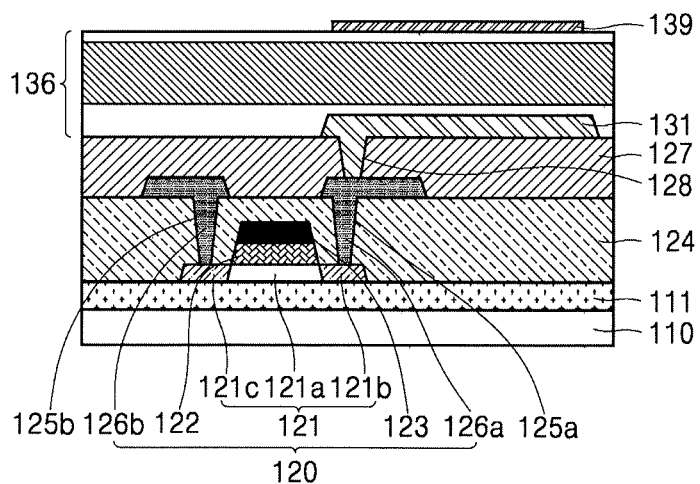
Figure 8:
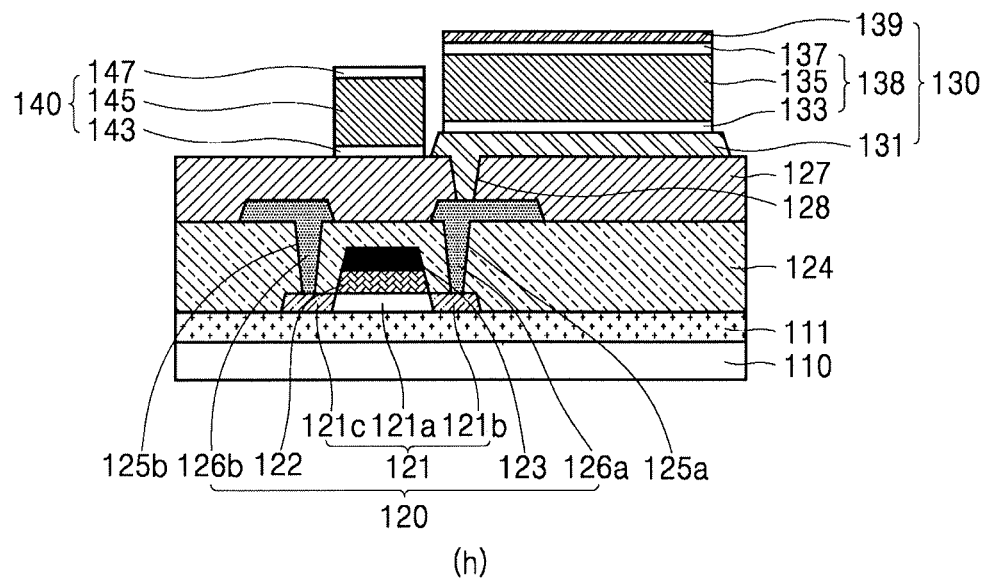
Figure 8:
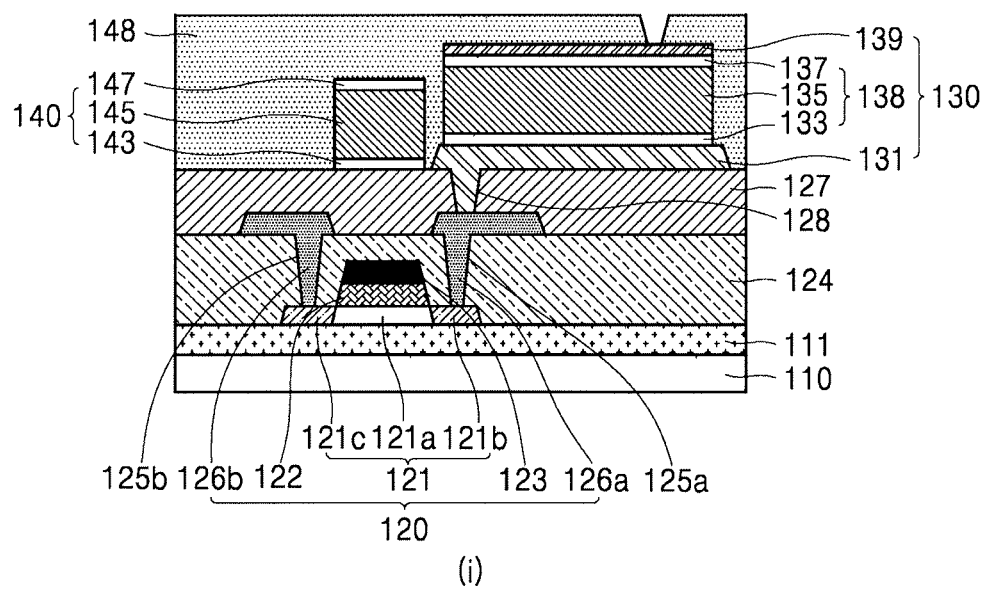
Figure 8:
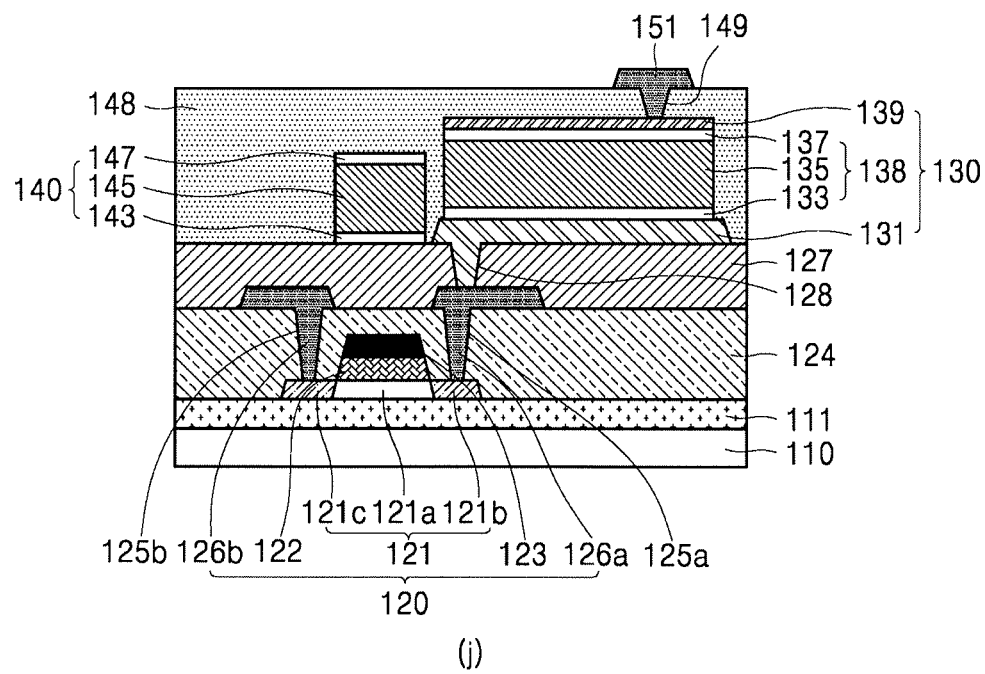
Figure 8:
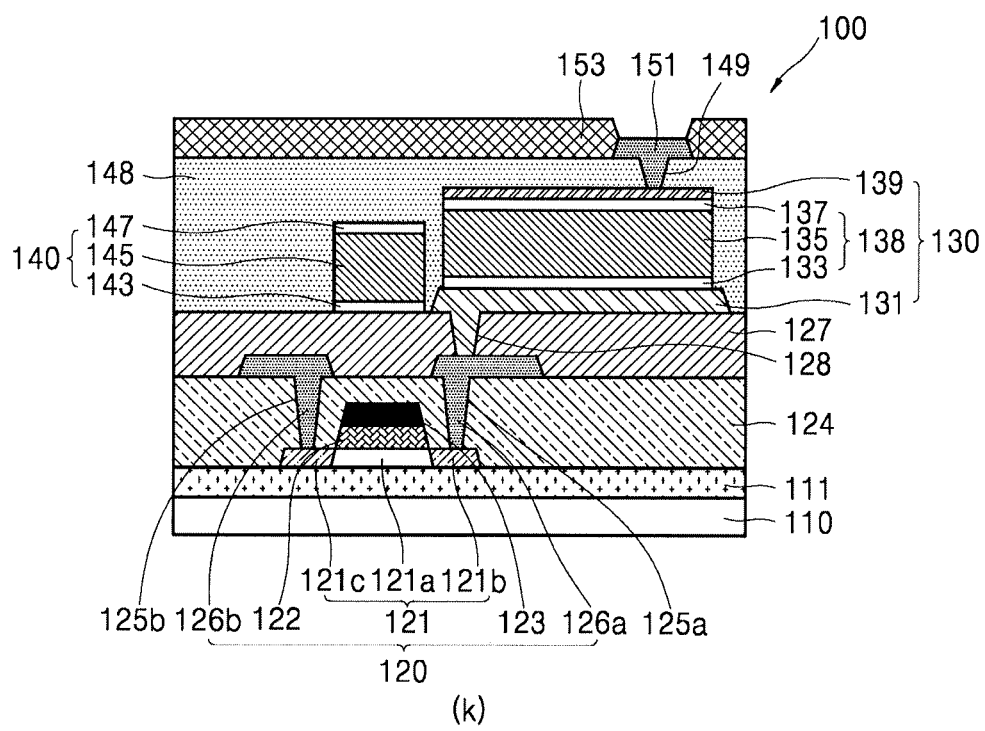

Referring to FIG. 8, a method for manufacturing the array substrate for the digital X-ray detector according to the embodiment of the present disclosure can include providing a base substrate 110, forming a thin film transistor 120 over a base substrate 110, forming a first protective layer 127 to cover the thin film transistor 120, forming a lower electrode 131 connected to the first protective layer 127 through the first contact holes (125a, 125b) by forming first contact holes (125a, 125b) in the first protective layer 127, forming a PIN film 136 to cover the first protective layer 127 and the lower electrode 131, forming an upper electrode 139 over the PIN film 136 corresponding to the lower electrode, and forming a second PIN layer corresponding to a thin film transistor 120 and a first PIN layer 138 corresponding to the lower electrode 131 by etching the PIN film 136 such that a second PIN layer 140 and the first PIN layer 138 are spaced apart from each other.

Referring to (a) of FIG. 8, the base substrate 110 can be provided and a buffer layer 111 can be formed over the base substrate 111. In this instance, the buffer layer 111 will herein be omitted for convenience of description.

Referring to (b), (c) and (d) of FIG. 8, the thin film transistor 120 can be formed over the base substrate 110. In more detail, a semiconductor layer 121, a gate insulation layer 122, and a gate electrode 123 can be formed over the buffer layer 111 by a deposition and patterning process.

In order to form a source region 121b and a drain region 121c respectively connected to a first electrode 126a and a second electrode 126b at both ends of the semiconductor layer 121, a doping layer can be formed at both ends of the semiconductor layer 121. In this instance, the gate electrode 123 can be formed to correspond to an upper portion of a channel region 121a of the semiconductor layer 121.

Thereafter, an interlayer insulation layer (also called an interlayer dielectric (ILD) layer) 124 can be formed to cover the gate electrode 123 and the semiconductor layer 121. In this instance, a first contact hole 125a can be formed over the source region 121b of the semiconductor layer 121, and a first contact hole 125b can be formed over the drain region 121c of the semiconductor layer 121, such that some regions of the semiconductor layer 121 can be exposed.

The first electrode 126a and the second electrode 126b can be formed over the interlayer insulation layer 124 by a deposition and patterning process, such that the first electrode 126a is electrically connected to the semiconductor layer 121 through the first contact hole 125a and the second electrode 126b is electrically connected to the semiconductor layer 121 through the first contact hole 125b by the deposition and patterning process.

Thereafter, the first protective layer 127 can be formed to cover the thin film transistor 120 as shown in (e) of FIG. 8. In the first protective layer 127, a second contact hole 128 can be formed over a portion corresponding to the first electrode 126a, such that the portion of the first electrode 126a can be exposed.

Referring to (f) of FIG. 8, a lower electrode 131 connected to the partially-exposed first electrode 126a can be formed over the first protective layer 127 by a deposition and patterning process.

Referring to (g) FIG. 8, a PIN film 136 can be formed to cover the first protective layer 127 and the lower electrode 131, and an upper electrode 139 can be formed over the PIN film 136 corresponding to the lower electrode 131 by a deposition and patterning process.

Referring to (h) FIG. 8, the patterning and etching process can be performed on the PIN film 136, such that a second PIN layer 140 corresponding to the thin film transistor 120 and a first PIN layer 138 corresponding to the lower electrode 131 can be simultaneously formed. In this instance, the second PIN layer 140 is formed to be spaced apart from the first PIN layer 138, such that the second PIN layer 140 is formed in an island shape spaced apart from the first PIN layer 138 and the lower electrode 131.

As described above, the second PIN layer 140 according to the embodiment is not formed by additional processing, and can be formed by changing only a pattern needed for patterning, that has been used in a conventional process for forming the first PIN layer 138 (e.g., especially, the PIN diode 130), to another pattern, such that the additional processing for use in the conventional art is no longer required to form the second PIN layer 140. As a result, a structure capable of minimizing thin film transistor (TFT) damage caused by X-rays can be formed by maximizing fabrication efficiency.

Referring to (i)-(k) of FIG. 8, a second protective layer 148 can be formed to cover the first PIN layer 138 and the second PIN layer 140, and a third contact hole 149 can be formed over the second protective layer 148 to partially expose the upper electrode 139. A bias electrode 151 can be formed over the second protective layer 148, such that the bias electrode 151 can be connected to the upper electrode 139 through the third contact hole 149 formed in the second protective layer 148. A third protective layer 153 can be formed to cover the bias electrode 151.

Figure 9:
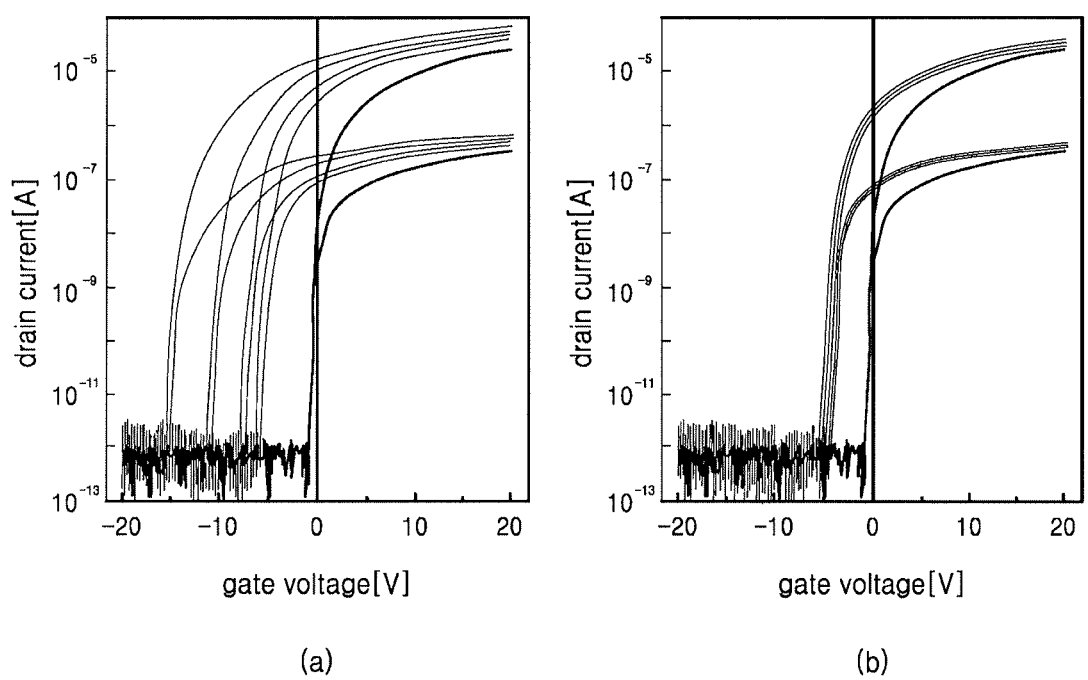
FIG. 9 illustrates a voltage-current (V-I) characteristic graph of one example and another voltage-current (V-I) characteristic graph of a comparison example when X-rays are emitted to a digital X-ray detector according to an embodiment of the present disclosure.

FIG. 9 illustrates voltage-current (V-I) characteristic graphs of a thin film transistor (TFT) according to the embodiments of the present disclosure. In more detail, the voltage-current (V-I) characteristic graph in (a) of FIG. 9 relates to a structure in which a separate PIN layer is not formed over the thin film transistor, and the voltage-current (V-I) characteristic graph in (b) of FIG. 9 relates to a structure in which a separate PIN layer, such as a second PIN layer is formed to cover the thin film transistor.

The comparison example shown in (a) of FIG. 9 relates to a structure in which a separate PIN layer is not formed over the thin film transistor (TFT). According to the structure shown in (a) FIG. 9, a gate insulation layer, a gate electrode, an interlayer insulation layer, a first protective layer, a second protective layer, and a third protective layer can be sequentially stacked over the semiconductor layer. X-rays can be emitted to the digital X-ray detector having the aforementioned structure. Here, X-rays emitted to the digital X-ray detector can have the radiation amount of 1000 Gy at the condition of 100 kV and 10 mA at the distance of 50 cm from the position of the digital X-ray detector.

The embodiment shown in (b) FIG. 9 relates to a structure in which a separate second PIN layer spaced apart from the first PIN layer of the PIN diode is formed over the thin film transistor. According to the structure shown in (b) FIG. 9, a gate insulation layer, a gate electrode, an interlayer insulation layer, a first protective layer, a second PIN layer, a second protective layer, and a third protective layer can be sequentially stacked over the semiconductor layer. Different from the comparison example in (a) of FIG. 9, the embodiment of (b) in FIG. 9 can further include the second PIN layer, and the remaining parts other than the second PIN layer in (b) of FIG. 9 can have the same conditions as those in (a) of FIG. 9.

According to the comparison example in (a) of FIG. 9, different from the situation of using a normal element (where Vth=0.10) prior to X-ray emission, a negative shift phenomenon may occur at the level of about "Vth=−7.90" after X-ray emission, such that X-ray scattering may also increase.

In other words, according to the comparison example in (a) of FIG. 9, the voltage-current (V-I) characteristic graph may be shifted to a negative voltage, such that it can be confirmed that a threshold voltage (Vth) of the oxide thin film transistor is shifted to a negative voltage. Due to driving characteristics of the thin film transistor, a threshold voltage of which is shifted to the negative voltage, reliability deterioration such as an off-current increase may unavoidably occur.

In contrast, as shown in (b) of FIG. 9, different from the situation of using a normal element (where Vth=0.10) prior to X-ray emission, a negative shift phenomenon may occur at the level of about only "Vth=−3.93" after X-ray emission, such that it can be confirmed that the embodiment has a lower negative phenomenon than the comparison example. In addition, it can also be confirmed that X-ray scattering is greatly reduced as compared to the comparison example.

That is, according to the embodiment, the degree of shifting the threshold voltage of the oxide TFT to the negative voltage is reduced and minimized, such that the embodiment has superior thin film transistor (TFT) reliability as compared to the comparison example.

As is apparent from the above description, the embodiments of the present disclosure can minimize the number of malfunctions of a digital X-ray detector by minimizing thin film transistor (TFT) damage caused by X-rays.

The embodiments of the present disclosure can minimize thin film transistor (TFT) damage caused by X-rays without increasing a thickness of a digital X-ray detector.

The embodiments of the present disclosure can minimize parasitic capacitance caused by a PIN diode.

The embodiments of the present disclosure can form a separate PIN layer capable of shielding and absorbing X-rays without using additional fabrication as compared to the related art, such that fabrication efficiency can be maximized.

The present disclosure described above can be variously substituted, altered, and modified by those skilled in the art to which the present disclosure pertains without departing from the scope and sprit of the present disclosure. Therefore, the present disclosure is not limited to the above-mentioned exemplary embodiments and the accompanying drawings.

What is claimed is:

1. An array substrate for a digital X-ray detector, the array substrate comprising:
    a base substrate;
    a thin film transistor disposed on the base substrate;
    a PIN diode including a lower electrode electrically connected to the thin film transistor, a first PIN layer disposed on the lower electrode, and an upper electrode disposed on the first PIN layer;
    a second PIN layer spaced apart from the PIN diode, the second PIN layer being disposed on the thin film transistor;
    a bias electrode electrically connected to the upper electrode; and
    a first protective layer disposed between the thin film transistor and the second PIN layer,
    wherein the thin film transistor includes a semiconductor layer, a gate electrode, and first and second electrodes connected to the semiconductor layer,
    wherein the first electrode is electrically connected to the lower electrode,
    wherein the lower electrode is spaced apart from the gate electrode without overlapping with the gate electrode, and
    wherein the second PIN layer has an island shape and is electrically isolated from the PIN diode.

2. The array substrate of claim 1, wherein the second PIN layer overlaps with the semiconductor layer.

3. The array substrate of claim 1, wherein the second PIN layer overlaps with the gate electrode.

4. The array substrate of claim 1, wherein the PIN diode is spaced apart from the gate electrode without overlapping with the gate electrode.

5. The array substrate of claim 4, wherein the first PIN layer is disposed at an inner side of the lower electrode.

6. The array substrate of claim 1, wherein the lower electrode and the second PIN layer are disposed on a same layer.

7. The array substrate of claim 1, further comprising:
    a second protective layer disposed on the first protective layer; and
    a third protective layer disposed on the second protective layer,
    wherein the second protective layer is between the first and third protective layers.

8. The array substrate of claim 7, wherein both the first PIN layer and the second PIN layer are embedded in the second protective layer, and
    wherein both the first PIN layer and the second PIN layer are disposed between the first and third protective layers.

9. The array substrate of claim 7, wherein a portion of the second protective layer separates the first PIN layer from the second PIN layer, and
    wherein both the first PIN layer and the second PIN layer are disposed between the first and third protective layers.

10. The array substrate of claim 1, wherein the lower electrode is wider than the first PIN layer.

11. The array substrate of claim 1, wherein a width of the lower electrode is approximately equal to a width of the first PIN layer.

12. The array substrate of claim 1, wherein a width of the lower electrode is smaller than a width of the first PIN layer.

13. The array substrate of claim 12, wherein a distance difference between an outermost edge of the lower electrode and an outermost edge of the first PIN layer is less than or equal to approximately 0.2 µm.

14. The array substrate of claim 1, wherein the first PIN layer includes:
    a first N-type semiconductor layer,
    a first intrinsic layer, and
    a first P-type semiconductor layer,
    wherein the second PIN layer includes:
    a second N-type semiconductor layer,
    a second intrinsic layer, and
    a second P-type semiconductor layer, and
    wherein the first N-type semiconductor layer and the second N-type semiconductor layer comprise a same material, the first intrinsic layer and the second intrinsic layer comprise a same material, and the first P-type semiconductor layer and the second P-type semiconductor layer comprise a same material.

15. The array substrate of claim 1, wherein a width of the second PIN layer is approximately equal to a width of a gate electrode of the thin film transistor or a channel of the thin film transistor.

16. A digital X-ray detector comprising:
    the array substrate according to claim 1; and
    a scintillator disposed on the array substrate.

17. An array substrate for a digital X-ray detector, the array substrate comprising:
    a base substrate;
    a thin film transistor disposed on the base substrate;
    a PIN diode including a lower electrode electrically connected to the thin film transistor, a first PIN layer disposed on the lower electrode, and an upper electrode disposed on the first PIN layer;
    a second PIN layer spaced apart from the PIN diode, the second PIN layer being disposed on the thin film transistor;
    a bias electrode electrically connected to the upper electrode; and
    a first protective layer disposed between the thin film transistor and the second PIN layer,
    wherein the thin film transistor includes a semiconductor layer, a gate electrode, and first and second electrodes connected to the semiconductor layer,
    wherein the first electrode is electrically connected to the lower electrode, wherein the PIN diode is spaced apart from the gate electrode without overlapping with the gate electrode, and wherein the second PIN layer has an island shape and is electrically isolated from the PIN diode.

18. An array substrate for a digital X-ray detector, the array substrate comprising:
   a base substrate;
   a thin film transistor disposed on the base substrate;
   a PIN diode including a lower electrode electrically connected to the thin film transistor, a first PIN layer disposed on the lower electrode, and an upper electrode disposed on the first PIN layer;
   a second PIN layer spaced apart from the PIN diode, the second PIN layer being disposed on the thin film transistor;
   a bias electrode electrically connected to the upper electrode; and
   a first protective layer disposed between the thin film transistor and the second PIN layer,
   wherein the second PIN layer has an island shape and is electrically isolated from the PIN diode.

19. The array substrate of claim 1, wherein a center of the second PIN layer is aligned with a center of the gate electrode.

20. The array substrate of claim 1, wherein an upper surface of the second PIN layer is lower than an upper surface of the first PIN layer.

* * * * *